US012687577B2

(12) United States Patent
Lee et al.

(10) Patent No.: US 12,687,577 B2
(45) Date of Patent: Jul. 21, 2026

(54) METHOD, DEVICE, AND SYSTEM FOR DETECTING FUSE CONFIGURATION FOR TRIMMING CIRCUIT

(71) Applicant: Samsung Electronics Co., Ltd., Suwon-si (KR)

(72) Inventors: Jaecheol Lee, Suwon-si (KR); Heeyeon Lim, Suwon-si (KR); Taeheon Lee, Suwon-si (KR); Doecook Kim, Suwon-si (KR); Taesung Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 18/506,435

(22) Filed: Nov. 10, 2023

(65) Prior Publication Data

US 2024/0159827 A1     May 16, 2024

(30) Foreign Application Priority Data

Nov. 11, 2022   (KR) ........................ 10-2022-0150979
Mar. 14, 2023   (KR) ........................ 10-2023-0033473

(51) Int. Cl.
G01R 31/317     (2006.01)
G01R 31/3183     (2006.01)
(52) U.S. Cl.
CPC . G01R 31/31718 (2013.01); G01R 31/31713 (2013.01); G01R 31/3183 (2013.01)
(58) Field of Classification Search
None
See application file for complete search history.

(56) References Cited

U.S. PATENT DOCUMENTS 6,975,945 B2 * 12/2005 Gedamu ................ G01R 31/74
                                                                     702/35
10,295,596 B1     5/2019 Ovadia
10,481,992 B1     11/2019 Ginty et al.
(Continued)

FOREIGN PATENT DOCUMENTS

EP           1126524 A2 *   8/2001   .......... H03M 1/1014
KR        102356126 B1     1/2022
KR      20240069575 A *    5/2024   ............. G06N 20/00

OTHER PUBLICATIONS

English translation of EP 1126524 A2 (Year: 2001).*
(Continued)

*Primary Examiner* — Jermele M Hollington
(74) *Attorney, Agent, or Firm* — Muir Patent Law, PLLC

(57) ABSTRACT

A method of generating a fuse configuration for trimming a circuit includes evaluating characteristics, corresponding to each of a plurality of fuse configurations, of the circuit trimmed based on the plurality of fuse configurations respectively, selecting at least one fuse configuration from among the plurality of fuse configurations, based on a result of the evaluating the characteristics of the circuit, calculating a contribution information by calculating a degree of influence of fuse data of each of the plurality of fuse configurations to the characteristics of the circuit, based on the plurality of fuse configurations and the characteristics, and generating at least one new fuse configuration, based on the selected at least one fuse configuration and the contribution information.

20 Claims, 16 Drawing Sheets

200

(56)  References Cited

U.S. PATENT DOCUMENTS

| | | | |
|---|---|---|---|
| 11,009,548 B2 | 5/2021 | Ong et al. | |
| 11,126,772 B1 | 9/2021 | Manna et al. | |
| 2008/0203525 A1* | 8/2008 | Jang | H01L 23/525 |
| | | | 257/529 |
| 2008/0238439 A1* | 10/2008 | Lin | G11C 17/165 |
| | | | 324/550 |
| 2023/0041988 A1* | 2/2023 | Lee | G11C 8/12 |

OTHER PUBLICATIONS

English translation of KR 20240069575 A (Year: 2024).*
J. Kim et al., "Machine Learning-Based Automatic Generation of
eFuse Configuration in NAND Flash Chip," 2019 IEEE International Test Conference (ITC), Washington, DC, USA.
Lundberg, et al., "From local explanations to global understanding
with explainable AI for trees," Natural Machine Intelligence, 2020,
pp. 56-67.

* cited by examiner $$Vout = Vin\left(1 + \frac{Rf}{Rg}\right)$$

Figure 5:
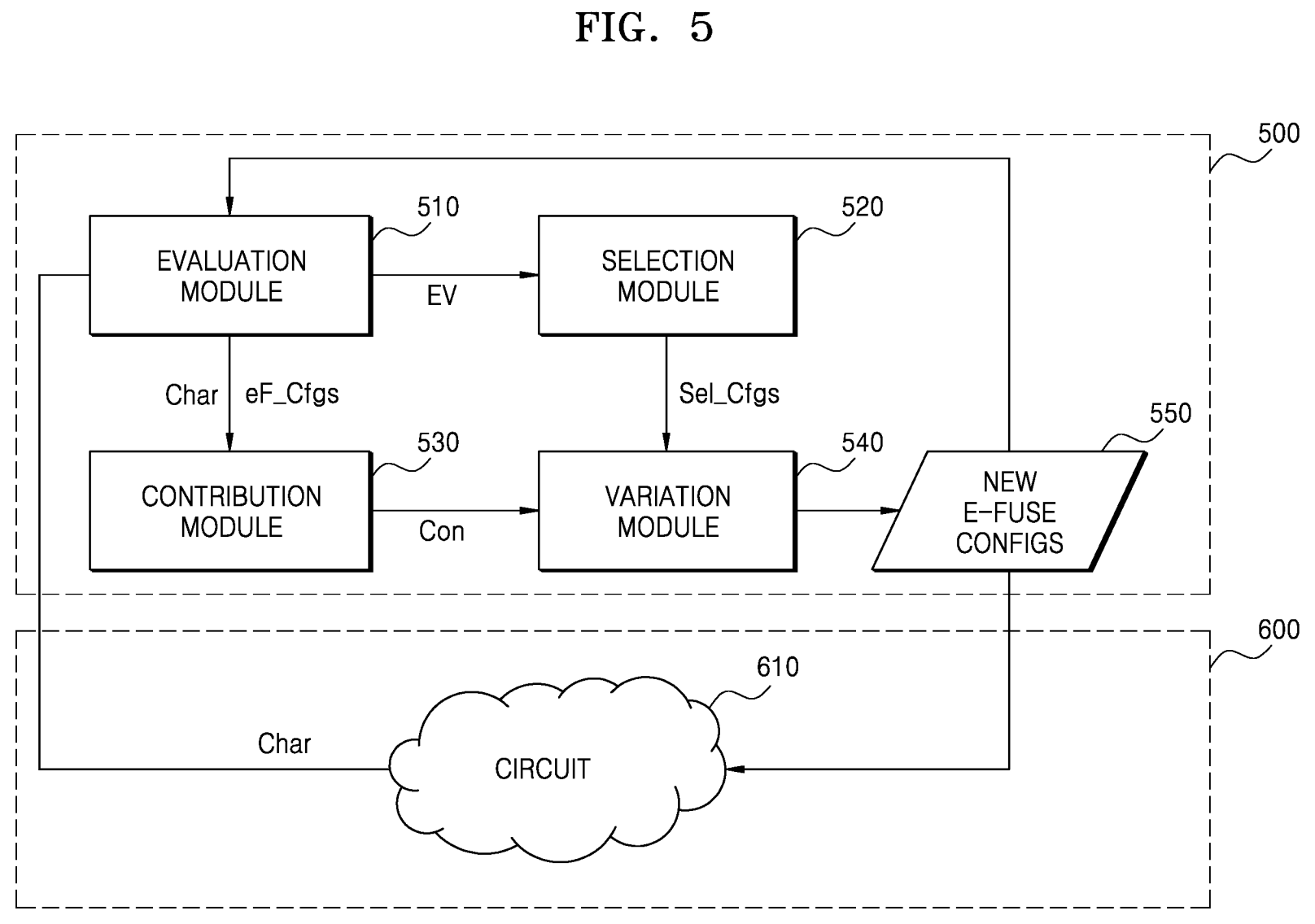

520 SELECTION MODULE

510 EVALUATION MODULE

EV

Char    eF_Cfgs

Sel_Cfgs

540 VARIATION MODULE

550 NEW E-FUSE CONFIGS

530 CONTRIBUTION MODULE

Con

600

610 CIRCUIT

Char

530

Mutation

FIG. 14

| BIT VALUE | PROBABILITY CALCULATION |
|:---:|:---:|
| 0 | $$\dfrac{P(s < 0 \mid X = 0)}{P(s < 0 \mid X = 0) + P(s < 0 \mid X = 1)}$$ |
| 1 | $$\dfrac{P(s < 0 \mid X = 1)}{P(s < 0 \mid X = 0) + P(s < 0 \mid X = 1)}$$ |

FIG.  15

| CHARACTERISTICS | Bit Value | P_X1[2] | P_X1[3] | P_X1[7] |
|:---:|:---:|:---:|:---:|:---:|
| Y1 | 0 | $P_{Y1\_20}$ | $P_{Y1\_30}$ | $P_{Y1\_70}$ |
| Y1 | 1 | $P_{Y1\_21}$ | $P_{Y1\_31}$ | $P_{Y1\_71}$ |
| Y2 | 0 | $P_{Y2\_20}$ | $P_{Y2\_30}$ | $P_{Y2\_70}$ |
| Y2 | 1 | $P_{Y2\_21}$ | $P_{Y2\_31}$ | $P_{Y2\_71}$ |

METHOD, DEVICE, AND SYSTEM FOR DETECTING FUSE CONFIGURATION FOR TRIMMING CIRCUIT

CROSS-REFERENCE TO RELATED APPLICATION

This application is based on and claims priority under 35 U.S.C. § 119 to Korean Patent Application Nos. 10-2022-0150979, filed on Nov. 11, 2022, and 10-2023-0033473, filed on Mar. 14, 2023, in the Korean Intellectual Property Office, the disclosures of which are incorporated by reference herein in their entireties.

BACKGROUND

The inventive concept relates to an electronic device, and more particularly, to a method, an apparatus, and a system for detecting or generating an optimal electrical fuse (E-Fuse) configuration for trimming a characteristic of a circuit.

After semiconductor devices are manufactured, fuses are used to improve and/or compensate for changes in characteristics of a circuit due to process variables. For example, the actual speed difference and/or timing fluctuations among semiconductor devices may be reduced, by trimming the semiconductor devices through a fuse. According to the advancement in semiconductor technology, the importance of technology for controlling fuses to effectively trim complex circuits is increasing.

SUMMARY

The inventive concept provides reducing the cost and time required to detect an optimal fuse configuration that further improves characteristics of a circuit.

According to an aspect of the present disclosure, a method of generating a fuse configuration for trimming a circuit includes evaluating characteristics, corresponding to each of a plurality of fuse configurations, of the circuit trimmed based on the plurality of fuse configurations respectively, selecting at least one fuse configuration from among the plurality of fuse configurations, based on a result of the evaluating the characteristics of the circuit, calculating a contribution information by calculating a degree of influence of fuse data of each of the plurality of fuse configurations to the characteristics of the circuit, based on the plurality of fuse configurations and the characteristics, and generating at least one new fuse configuration, based on the selected at least one fuse configuration and the contribution information.

According to an aspect of the present disclosure, a test device for generating a fuse configuration for trimming a circuit includes an evaluation module configured to evaluate characteristics, corresponding to each of a plurality of fuse configurations, of the circuit trimmed based on the plurality of fuse configurations respectively, a selection module configured to select at least one fuse configuration from among the plurality of fuse configurations, based on a result of evaluating the characteristics of the circuit, a contribution module configured to calculate a contribution information by calculating a degree of influence of fuse data of each of the plurality of fuse configurations to characteristics of the circuit, based on the plurality of fuse configurations and the characteristics, and a variation module configured to generate at least one new fuse configuration, based on the selected at least one fuse configuration and the contribution information.

According to an aspect of the present disclosure, a system includes a semiconductor device configured to receive a plurality of fuse configurations, output characteristics, corresponding to each of the plurality of fuse configurations, of the semiconductor device that is trimmed respectively according to the plurality of fuse configurations, and a test device configured to generate at least one new fuse configuration, based on the plurality of fuse configurations and the characteristics of the semiconductor device, and provide the at least one new fuse configuration to the semiconductor device. The test device is further configured to evaluate the characteristics of the semiconductor device trimmed based on the plurality of fuse configurations respectively, select at least one fuse configuration from among the plurality of fuse configurations, based on a result of evaluating the characteristics of the semiconductor device, calculate a contribution information by calculating a degree of influence of fuse data of each of the plurality of fuse configurations to the characteristics of the semiconductor device, based on the plurality of fuse configurations and the characteristics of the semiconductor device, and generate at least one new fuse configuration, based on the selected at least one fuse configuration and the contribution information.

BRIEF DESCRIPTION OF THE DRAWINGS

Embodiments will be more clearly understood from the following detailed description taken in conjunction with the accompanying drawings in which:

FIG. 5 is a block diagram schematically illustrating a structure of a test device according to an embodiment;

FIG. 14 is a diagram illustrating a method of calculating a bit selection probability, according to an embodiment;

FIG. 15 is a diagram illustrating bit selection probabilities for characteristic improvement, according to an embodiment.

DETAILED DESCRIPTION OF THE EMBODIMENTS

Hereinafter, embodiments of the inventive concept are described in detail with reference to the accompanying drawings.

Figure 1:
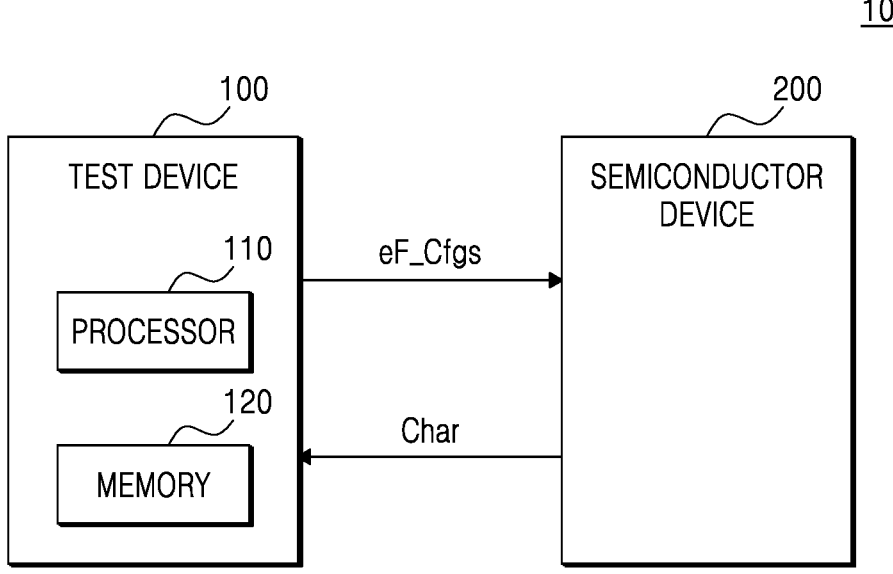
FIG. 1 is a block diagram illustrating an electrical fuse (E-Fuse) configuration detection system according to an embodiment.

FIG. 1 is a block diagram illustrating an electrical fuse (E-Fuse) configuration detection system 10 according to an embodiment.

Referring to FIG. 1, the E-fuse configuration detection system 10 may include a test device 100 and a semiconductor device 200. The E-Fuse configuration detection system 10 may be a system trimming a circuit included in the semiconductor device 200 to optimize the circuit.

The test device 100 may transmit E-Fuse configurations eF_Cfgs (i.e., a signal representing the E-Fuse configurations) to the semiconductor device 200. In some embodiments, each of the E-Fuse configurations eF_Cfgs may include n fuses (where n is a natural number equal to or greater than 1), and as described below with reference to FIG. 3, each of the fuses may be expressed as fuse data eF_DTA (or E-Fuse data). For example, each E-Fuse configuration includes a plurality of bits which correspond to a plurality of fuses in a fuse block. For example, if a fuse block is formed of M fuses for trimming a characteristic of a circuit, the E-Fuse configuration has M bits of which each bit corresponds to a corresponding fuse of the M fuses. In order to trim the circuit included in the semiconductor device 200, the fuse data eF_DTA may include information for controlling a fuse circuit as illustrated with reference to FIG. 4. The E-Fuse configurations eF_Cfgs may include various different data to control the n fuses in various ways.

The semiconductor device 200 may receive the E-Fuse configurations eF_Cfgs from the test device 100 and control the circuit included in the semiconductor device 200. Specifically, as described below with reference to FIG. 2, the semiconductor device 200 may control fuses based on each of the E-Fuse configurations eF_Cfgs, and trim an internal circuit based on the controlled fuses. The semiconductor device 200 may output a characteristics Char of the trimmed circuit. For example, the characteristics Char may include information indicating a voltage characteristic of the trimmed circuit. Alternatively, the characteristics Char may include information about timing of the circuit. The characteristics Char is not limited to the above examples, and may include various characteristics of a semiconductor circuit. The semiconductor device 200 may transmit the characteristics Char of the trimmed circuit based on the received E-Fuse configurations eF_Cfgs to the test device 100.

The test device 100 may include a processor 110 (e.g., a CPU) and a memory 120. The processor 110 may control the overall operation of the test device 100, and more specifically, operations of other components constituting the test device 100. For example, the processor 110 may execute software (an application program, an operating system (OS), a device driver, and a module) to be executed in the test device 100. For example, the processor 110 may execute the OS or the module loaded into the memory 120 of the test device 100. That is, the processor 110 may execute various application programs or modules to be driven based on the operating system.

The OS or the application programs may be loaded into the memory 120. When the test device 100 is booted, an OS image may be loaded into the memory 120 based on a booting sequence. All operations of the test device 100 may be supported by the OS. Similarly, the application programs (e.g., modules) may be loaded into the memory 120 to provide a related service according to selection of a user.

The memory 120 may be volatile memory such as static random access memory (SRAM) or dynamic random access memory (DRAM), or non-volatile memory such as phase-change random access memory (PRAM), magnetic random access memory (MRAM), resistance random access memory (ReRAM), ferroelectric random access memory (FRAM), a flash memory, etc. In some embodiments, the memory 120 may store the E-Fuse configurations eF_Cfgs generated by the test device 100 and/or information about the characteristics Char of the circuit received from the semiconductor device 200.

The test device 100 may receive the characteristics Char and perform an optimal E-Fuse configuration generation and/or detection operation according to an embodiment through the processor 110. In some embodiments, the processor 110 may be configured to execute instructions that perform at least one of various operations of detecting or generating the E-Fuse configurations eF_Cfgs. In some embodiments, to detect an optimal E-Fuse configuration according to an embodiment, the processor 110 may control various modules as described below with reference to FIG. 5. Specifically, the processor 110 may drive (i.e., may operate) an evaluation module 510, a selection module 520, a contribution module 530, and a variation module 540 loaded therein, thereby performing the optimal E-Fuse configuration generation and/or detection operation. Although not shown, the processor 110 may further drive various other modules for optimizing circuit trimming. Such a processor 110 may be implemented as a general-purpose processor, a dedicated processor, or an application processor.

The module(s) and the term 'module' used below refer to a software or hardware component such as Field Programmable Gate Array (FPGA) or Application Specific Integrated Circuit (ASIC), and the 'module' may perform at least one specific function. However, the 'module' is not limited to software or hardware. The 'module' may be configured to reside on an addressable storage medium and may be configured to reproduce one or more processors. Thus, as an example, the 'module' may include components such as software components, object-oriented software components, class components, and task components, processes, functions, properties, procedures, subroutines, segments of program code, drivers, firmware, microcode, circuit, data, database, data structures, tables, arrays, and variables. Functions provided within the components and the 'modules' may be combined into a smaller number of components and 'modules' or further separated into additional components and 'modules'.

As a result, the test device 100 may generate and transmit the E-Fuse configurations eF_Cfgs to the semiconductor device 200, receive the characteristics Char of the circuit based on the E-Fuse configurations eF_Cfgs from the semiconductor device 200, and perform the optimal E-Fuse configuration generation and/or detection operation.

Figure 2:
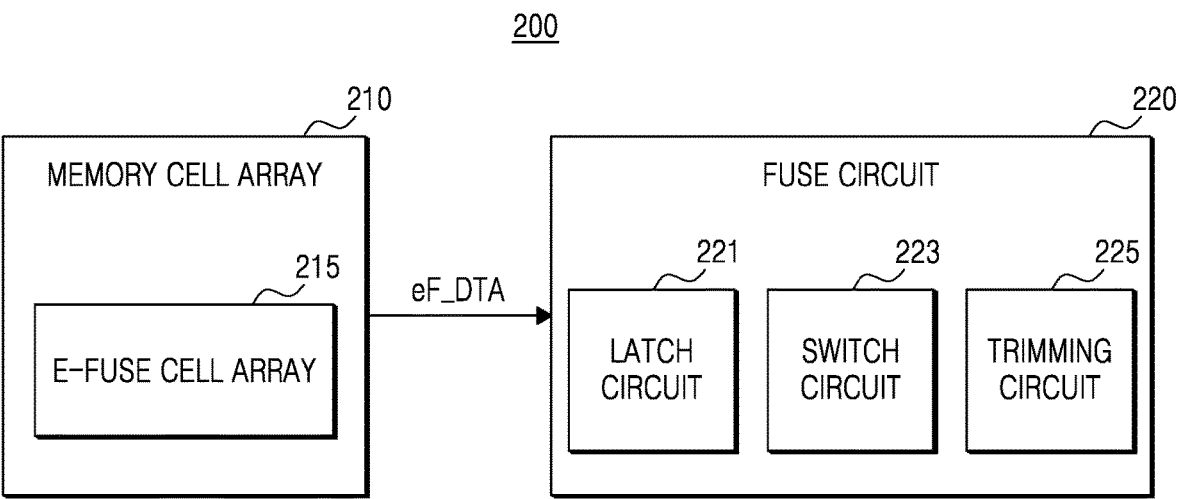
FIG. 2 is a block diagram schematically illustrating a structure of a semiconductor device of FIG. 1.

FIG. 2 is a block diagram schematically illustrating a structure of the semiconductor device 200 of FIG. 1.

Referring to FIG. 2, the semiconductor device 200 may include a memory cell array 210 and a fuse circuit 220. The semiconductor device 200 may control the fuse circuit 220 based on the fuse data eF_DTA.

In some embodiments, the semiconductor device 200 may store the E-Fuse configurations eF_Cfgs of FIG. 1 in an E-Fuse cell array 215. The E-Fuse configurations eF_Cfgs of FIG. 1 may include the fuse data eF_DTA. For example, the fuse data eF_DTA may mean data (e.g., 8-bit data) indicating each fuse included in the E-Fuse configurations eF_Cfgs. Also, the fuse data eF_DTA may include information for controlling operations of fuses included in the fuse circuit 220. In other words, the fuse data eF_DTA may mean setting data necessary for an operation of a circuit of the semiconductor device 200. As an embodiment, the fuse data eF_DTA may include DC trim information, option information, repair and/or bad block information, etc.

The fuse circuit 220 may include a latch circuit 221, a switch circuit 223, and a trimming circuit 225. The fuse circuit 220 may further include other components trimming the circuit included in the semiconductor device 200. The fuse circuit 220 may receive the fuse data eF_DTA stored in the E-Fuse cell array 215 to control the latch circuit 221, the switch circuit 223, and the trimming circuit 225.

Specifically, a process of setting an operating environment of the semiconductor device 200 by using the fuse data eF_DTA is as follows. When power is applied to the semiconductor device 200, an initial read operation may be performed on the fuse data eF_DTA stored in the E-Fuse cell array 215. The fuse data eF_DTA read by the initial read operation may be stored in the latch circuit 221. The fuse data eF_DTA stored in the latch circuit 221 may be provided to the switch circuit 223. Each of switches of the switch circuit 223 may control a turn-on/off state of a corresponding circuit, that is, the corresponding trimming circuit 225, according to the fuse data eF_DTA. For example, the trimming circuits 225 such as a DC trim circuit, a repair circuit, and/or a timing circuit may be controlled according to turn-on/off of the switches. A specific example in this regard is described below with reference to FIG. 4.

Figure 3:
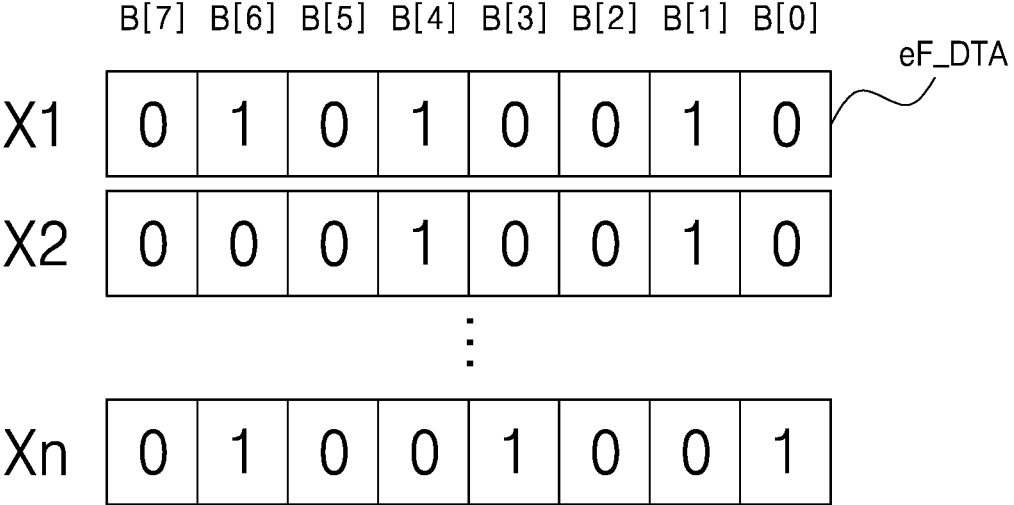
FIG. 3 is a diagram illustrating fuse data according to an embodiment.

FIG. 3 is a diagram illustrating the fuse data eF_DTA according to an embodiment.

Referring to FIG. 3, the E-Fuse configuration eF_Cfg may include n (n is a natural number greater than or equal to 1) fuses X1, X2, . . . , Xn. Each of the fuses X1, X2, . . . , Xn may include 8-bit data. However, the fuses X1, X2, . . . , Xn are not limited thereto, and may include data of various bits. For example, the fuses X1, X2, . . . , Xn may include 5-bit data or 10-bit data. Hereinafter, for convenience of explanation, it is assumed that the fuses X1, X2, . . . , Xn are represented by 8-bit data.

Each of bits of the fuse data eF_DTA corresponding to one fuse may be referred to as B[0] to B[7]. For example, a second bit of the fuse data eF_DTA of the fuse X1 may be expressed as B[1] and may have a value of 1 as shown. Alternatively, the second bit of the fuse data eF_DTA of the fuse X1 may be expressed as X1[1]. For example, an eighth bit of the fuse X2 may be expressed as X2[7].

In some embodiments, for example, the fuse data eF_DTA may include voltage information, timing information, repair information, and/or bad block information, etc. The fuse data eF_DTA may include a plurality of pieces of information about an operating environment of the semiconductor device 200 described above with reference to FIG. 2. For example, certain upper bits of the 8-bit fuse data eF_DTA may store the voltage information, certain next bits thereof may store the timing information, and certain lower bits thereof may include the repair information.

That is, for example, referring to FIG. 2, the fuse data eF_DTA of the fuse X1 may be read from the E-Fuse cell array 215 and transmitted to the fuse circuit 220. The fuse data eF_DTA stored in the latch circuit 221 may be provided to the switch circuit 223, and turn-on/off of the switches may be respectively controlled by the bits of the fuse data eF_DTA to control the trimming circuit 225.

Figure 4:
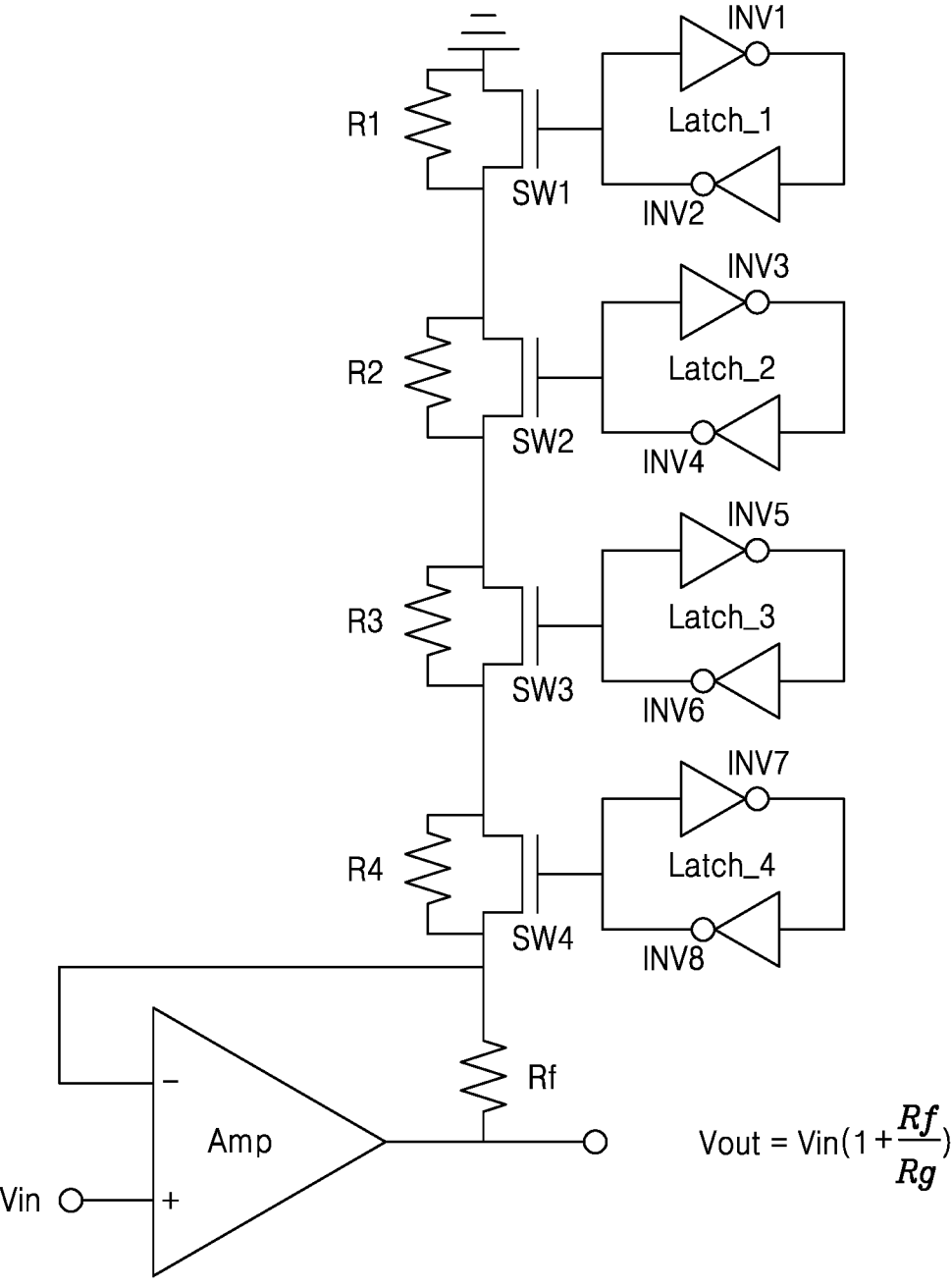
FIG. 4 is a circuit diagram illustrating an operation of a fuse circuit of a semiconductor device according to an embodiment.

FIG. 4 is a circuit diagram illustrating an operation of the fuse circuit 220 of the semiconductor device 200 according to an embodiment.

Referring to FIG. 4, through control of the fuse circuit 220 of the semiconductor device 200, for example, an output voltage \Tout of a circuit included in the semiconductor device 200 may be controlled (or adjusted).

Referring to FIG. 2, the exemplary circuit diagram of FIG. 4 for adjusting the output voltage $V_{out}$ may correspond to the trimming circuit 225 adjusting a voltage of the circuit included in the semiconductor device 200. For example, a first latch circuit Latch_1 to a fourth latch circuit Latch_4 may correspond to the latch circuit 221, and a first switch SW1 to a fourth switch SW4 may correspond to the switch circuit 223.

The first latch circuit Latch_1 may include a first inverter INV1 and a second inverter INV2, through which a latch operation may be performed, and similarly, a second latch circuit Latch_2 to the fourth latch circuit Latch_4 may include a third inverter INV3 to an eighth inverter INV8 respectively corresponding thereto, through which the latch operation may be performed. For example, the first latch circuit Latch_1 may receive and latch a bit of the corresponding fuse data eF_DTA. The bit stored in the first latch circuit Latch_1 may be provided to the first switch SW1, and an on/off state of the first switch SW1 may be controlled according to a value of the bit.

The first switch SW1 to the fourth switch SW4 may be connected in parallel with resistors R1 to R4, respectively, to adjust the output voltage $V_{out}$. For example, when values stored in the first to fourth latch circuits Latch_1 to Latch_4 by the fuse data eF_DTA are all logic low levels, the first to fourth switches SW1 to SW4 may be all turned off, and a value of a resistor $R_g$ may be a value obtained by summing all values of the resistors R1 to R4. Accordingly, an amplifier Amp may receive an input voltage $V_{in}$ and output the output voltage $V_{out}$ as shown based on a ratio between the value of the resistor $R_g$ and a value of a resistor $R_f$.

FIG. 5 is a block diagram schematically illustrating a structure of a test device 500 according to an embodiment.

Referring to FIG. 5, the test device 500 according to an embodiment may use an evaluation module 510, a selection module 520, and a contribution module 530, and a variation module 540 to generate new E-Fuse configurations 550 different from E-Fuse configurations of an initial E-fuse configuration. The test device 500 in FIG. 5 may correspond to the test device 100 illustrated with reference to FIG. 1. The modules 510 to 540 may be executed by a processor (e.g., the processor 110 in FIG. 1).

The test device 500 may transmit the new E-Fuse configurations 550 to a semiconductor device 600, and the semiconductor device 600 may trim a circuit 610 included in the semiconductor device 600 based on the new E-Fuse configurations 550. The semiconductor device 600 in FIG. 5 may correspond to the semiconductor device 200 illustrated with reference to FIG. 1. The semiconductor device 600 may transmit the characteristics Char of the trimmed circuit 610 to the test device 500. In some embodiments, the test device 500 may measure the characteristics Char of the circuit 610 obtained by trimming the circuit 610 based on the new E-Fuse configurations 550.

In some embodiments, the evaluation module 510 may evaluate each of the E-Fuse configurations eF_Cfgs based on the characteristics Char of the circuit 610 output from the semiconductor device 600 based on each of the E-Fuse configurations eF_Cfgs. For example, the characteristics Char of the circuit 610 may include voltage information, timing information, and/or repair information, etc. as described above, and the evaluation module 510 may evaluate the corresponding E-Fuse configurations eF_Cfgs based on the various types of information. The evaluation module 510 may transmit values calculated through evaluation, that is, evaluated values (EV), to the selection module 520. The evaluation module 510 may transmit the E-Fuse configurations eF_Cfgs and the characteristics Char of the circuit 610 respectively corresponding thereto to the contribution module 530. In some embodiments, the evaluation module 510 may include a voltage meter, a test pattern generator to evaluate timing parameters of the semiconductor device 200, or a memory cell test function unit for identifying addresses of defective cells and determining whether such defective cells can be repaired. For example, when a voltage generating circuit of the semiconductor device 200 is trimmed to have an optimal voltage, the characteristics Char of the circuit may be an output voltage of the circuit measured by a voltage meter of the evaluation module 510. When a circuit related with a signal path in the semiconductor device is trimmed to have an optimal timing margin, the characteristics Char of the circuit may be a timing margin measured for a test pattern generated to measure such timing margin. When defective memory cells are repaired, the characteristics Char may be a repair algorithm to repair such defective memory cells using redundant memory cells.

The selection module 520 may select some of the E-Fuse configurations eF_Cfgs based on the received evaluation values EV. In some embodiments, the selection module 520 may score the evaluation value EV corresponding to each of the E-Fuse configurations eF_Cfgs. In some embodiments, the selection module 520 may select the E-Fuse configurations having a reference score or higher based on a scoring result. The reference score may be controlled through external control, etc. The selection module 520 may transmit selected configurations Sel_Cfgs to the variation module 540 to generate another new E-Fuse configuration in search of an optimum E-Fuse configuration.

In some embodiments, the variation module 540 may receive the selected configurations Sel_Cfgs to perform a variation operation. The variation operation may be an operation of varying (or manipulating) a composition (i.e., bits of the fuse data eF_DTA) of the fuse data eF_DTA indicating each fuse. As an embodiment, the variation module 540 may receive the selected configurations Sel_Cfgs and perform a crossover operation and/or a mutation operation as described below with reference to FIGS. 9 and 10. The variation module 540 may generate a new fuse configuration based on the variation operation.

The contribution module 530 may receive the E-Fuse configurations eF_Cfgs and the characteristics Char of the circuit 610 respectively corresponding thereto to calculate a contribution Con (i.e., contribution information) of each fuse. Here, the contribution Con may be a value obtained by quantifying an influence of the fuse data eF_DTA included in each of the E-Fuse configurations eF_Cfgs on the characteristics of the circuit 610. That is, the contribution module 530 may calculate the contribution Con of the fuse data eF_DTA corresponding to each of fuses included in each of the E-Fuse configurations eF_Cfgs to the characteristics of the circuit 610. Referring to FIGS. 3 and 5, for example, the contribution module 530 may calculate an influence of X2[7] on the characteristics of the circuit 610. For example, the contribution Con of X2[7] to the characteristics of the circuit 610, through trimming a fuse corresponding to X2[7] of the fuse data eF_DTA. The fuse corresponding to X2[7] may be an eighth bit of the fuse X2. In some embodiments, the contribution module 530 may calculate the contribution Con based on a machine learning model and an analysis model, as described below with reference to FIGS. 7 and 8. The contribution module 530 may transmit the calculated contribution Con to the variation module 540. In some embodiments, the contribution module 530 may calculate the influence of each bit of the fuse data eF_DTA based on a trained machine learning model and an analysis model (see, FIG. 8). For example, the contribution module 530 may input the selected E-fuse configuration eF_Cfgs and its measured or calculated characteristics Char into a learned machine learning model trained using historical data to identify the contribution Con of each bit of the E-fuse configuration eF_Cfgs.

In some embodiments, the variation module 540 may calculate a probability for generating a new fuse configuration based on the received contribution Con, as described below with reference to FIGS. 11 to 15. More specifically, the variation module 540 may calculate the probability for generating the new fuse configuration in a direction in which the characteristics Char of the circuit 610 are improved based on a distribution of the contribution Con. First, the variation module 540 may be known of an influence of a bit (e.g., X2[7] of the given fuse configuration) on the characteristics Char of the circuit 610, through the contribution Con of each bit of the fuse data Ef_DTA to the characteristics Char of the circuit 610. Next, the variation module 540 may calculate a probability that a bit (e.g., X2[7] of a new fuse configuration) of the new fuse configuration corresponding to the bit (e.g., X2[7] of the given fuse configuration) needs to have a specific value, in order to further improve the characteristics Char of the circuit 610, through a ratio of the distribution of bits corresponding to a direction (i.e., a section) in which the characteristics Char are improved in the distribution of the contribution Con. That is, based on a distribution ratio of bits having the contribution Con to improve the characteristics Char of the circuit 610 at a specific value (e.g., 0 or 1) of a bit, the variation module 540 may generate a new fuse configuration to have the specific value at a probability corresponding to the distribution ratio. In other words, the variation module 540 may calculate the probability that the bit needs to have the specific value in the new fuse configuration, that is, a selection probability (hereinafter, a bit selection probability) of each bit value of the fuse data eF_DTA to be included in the new fuse configuration. As described below with reference to FIG. 16, the variation module 540 may generate a fuse configuration based on the bit selection probability, and the variation module 540 may generate the new E-Fuse configurations 550 by summing a new fuse configuration based on variation and a new fuse configuration based on the bit selection probability.

In the same manner as described above, the test device 500 may transmit the new E-Fuse configurations 550 to the semiconductor device 600, and the semiconductor device 600 may transmit the characteristics Char of the circuit 610 according to trimming based on the new E-Fuse configurations 550 to the test device 500. The evaluation module 510 may evaluate each of the new E-Fuse configurations 550 based on the characteristics Char. As described above, the test device 500 may repeat generation and evaluation of E-Fuse configurations, and reflect the contribution of the given E-Fuse configurations corresponding to the improvement of characteristics to the generation of new E-Fuse configurations, thereby detecting or generating optimal E-Fuse configurations.

As a result, the test device 500 according to an embodiment may generate an optimal fuse configuration through the above-described operation (or an algorithm described below with reference to FIG. 6). Further, the test device 500 may generate a fuse configuration capable of more effectively improving characteristics (performance) of a circuit, by utilizing the contribution to generate the optimal configuration. The cost for detecting or generating the optimal fuse configuration may be reduced based on the contribution.

In addition, the test device 500 according to an embodiment may generate and utilize the contribution based on machine learning, thereby overcoming the limitations of optimization, and generating a more sophisticated fuse configuration with an enhanced effect of improving characteristics, and furthermore, reducing a deviation of improvement according to the capability of a user, etc.

In addition, the influence (contribution) of the fuse to the entire circuit (or a semiconductor device) may be quantified and provided, and such information may be used to improve characteristics.

Figure 6:
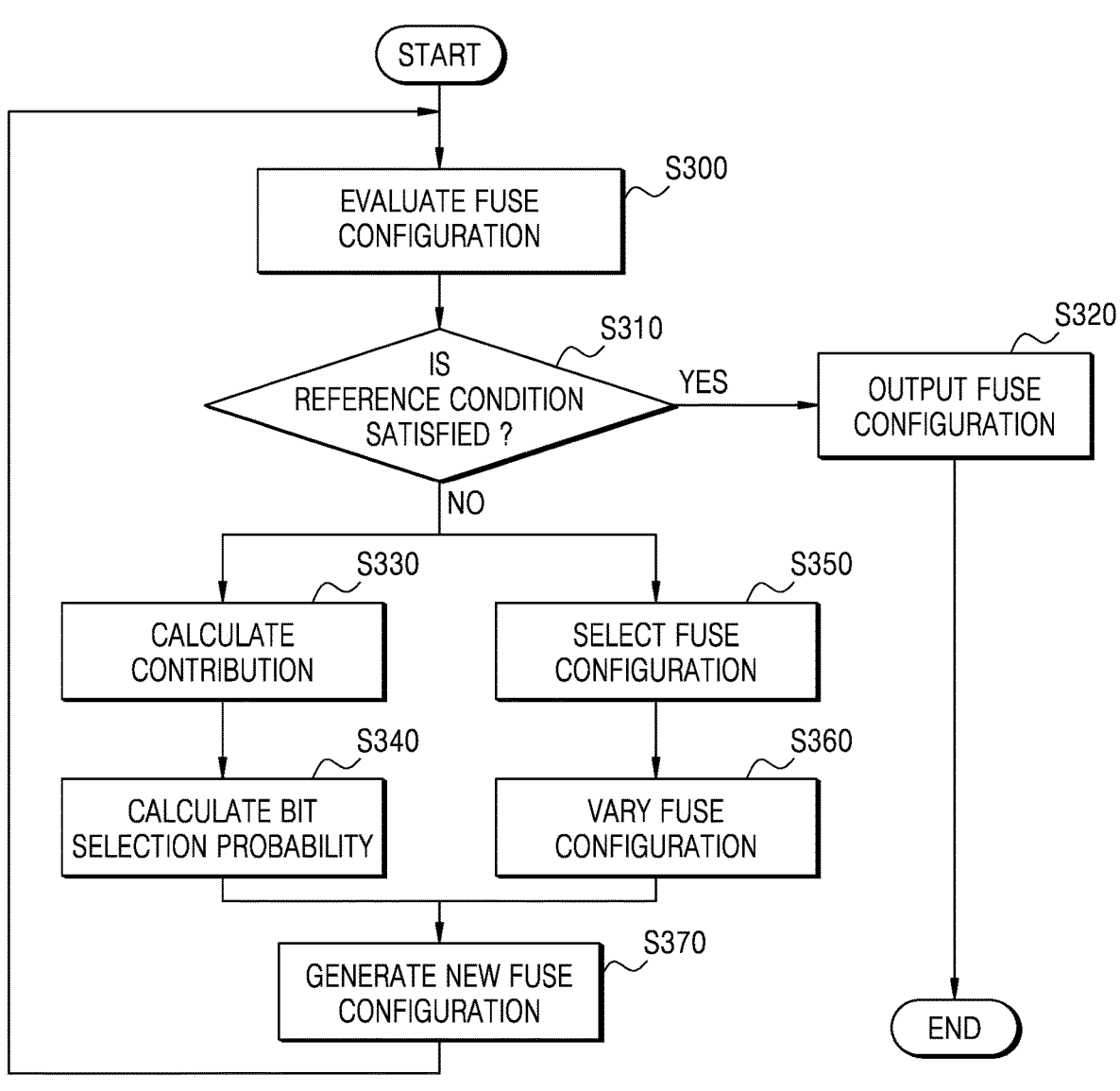
FIG. 6 is a flowchart illustrating a fuse configuration detection method according to an embodiment.

FIG. 6 is a flowchart illustrating a fuse configuration detection method according to an embodiment.

Referring to FIGS. 5 and 6, the test device 500 may detect and generate an optimal E-Fuse configuration based on the method according to an embodiment. The test device 500 is described in FIG. 6 as performing the method according to an embodiment, but the inventive concept is not limited thereto. That is, for example, the inventive concept may be performed in various aspects by a semiconductor device, a separate device trimming a circuit, or a processor capable of executing a module or software capable of performing the inventive concept, etc.

The evaluation module 510 may evaluate each of the E-Fuse configurations eF_Cfgs based on the received characteristics Char of a circuit (S300). The evaluation module 510 may determine whether there is an E-Fuse configuration that satisfies a reference condition among the E-Fuse configurations eF_Cfgs according to an evaluation result (S310). As described above, the characteristics Char may include various characteristics of a semiconductor circuit, and in some embodiments, the evaluation module 510 may determine whether voltage characteristics and timing characteristics of the circuit satisfy the reference condition. For example, the evaluation module 510 may determine whether the voltage characteristics and the timing characteristics have values within a specific range. The reference condition (i.e., the specific range) may be adjusted through external control, etc.

When the characteristics Char satisfies the reference condition, the test device 500 (specifically, for example, the evaluation module 510) may output a fuse configuration corresponding thereto as a result (S320). In some embodiments, when a plurality of fuse configurations have the characteristics Char that satisfy the reference condition, the test device 500 may perform an additional operation to output an optimal configuration. For example, a first result configuration and a second result configuration may satisfy the reference condition. The test device 500 may trim a plurality of semiconductor devices (or chips) including the circuit based on each of the first and second result configurations to receive the characteristics Char respectively corresponding to the plurality of semiconductor devices. Among the first and second result configurations, the test device 500 may output, as a result, a configuration having the least variation in the characteristics Char in the plurality of semiconductor devices.

On the other hand, when the characteristics Char does not satisfy the reference condition, the test device 500 may generate a new fuse configuration to detect a more optimized E-Fuse configuration.

Specifically, the selection module 520 may select some fuse configurations among the E-Fuse configurations eF_Cfgs (S350). In some embodiments, the selection module 520 may score the evaluation result with respect to the characteristics Char based on each of the E-Fuse configurations eF_Cfgs. In some embodiments, the selection module 520 may select fuse configurations having scores greater than or equal to a reference score based on a scoring result. The reference score may be adjusted through external control, etc.

Meanwhile, the contribution module 530 may calculate the contribution Con of each of fuses of the E-Fuse configurations eF_Cfgs (S330) to the circuit. In some embodiments, the contribution module 530 may calculate the contribution Con of the fuse data eF_DTA of each of the fuses to the circuit through a machine learning model and an analysis model. As an embodiment, the contribution module 530 may quantify an influence of the fuse itself on the circuit by summing the contribution Con of the fuse data eF_DTA of each fuse.

The variation module 540 may vary the selected fuse configurations (S360). In some embodiments, the variation module 540 may crossover and/or mutate the selected fuse configurations. Also, in some embodiments, the variation module 540 may calculate a bit selection probability indicating a probability that each bit of the fuse data eF_DTA in a new fuse configuration needs to have a specific value (e.g., 0 or 1) based on the contribution Con as described above (S340). As a result, the variation module 540 may generate a new fuse configuration by adding a fuse configuration generated by the variation and a fuse configuration generated based on the probability (S370).

Figure 7:
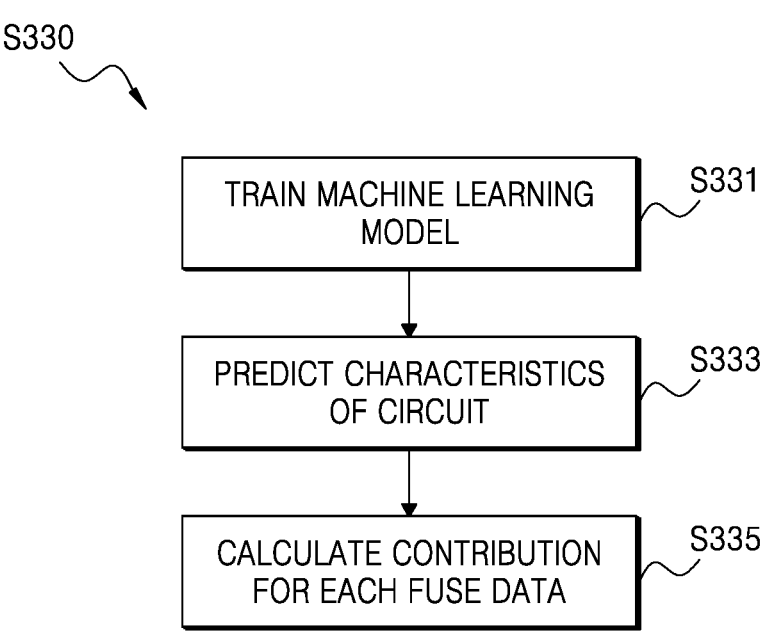
FIGS. 7 and 8 are diagrams for explaining a contribution calculation process according to an embodiment.
Figure 8:
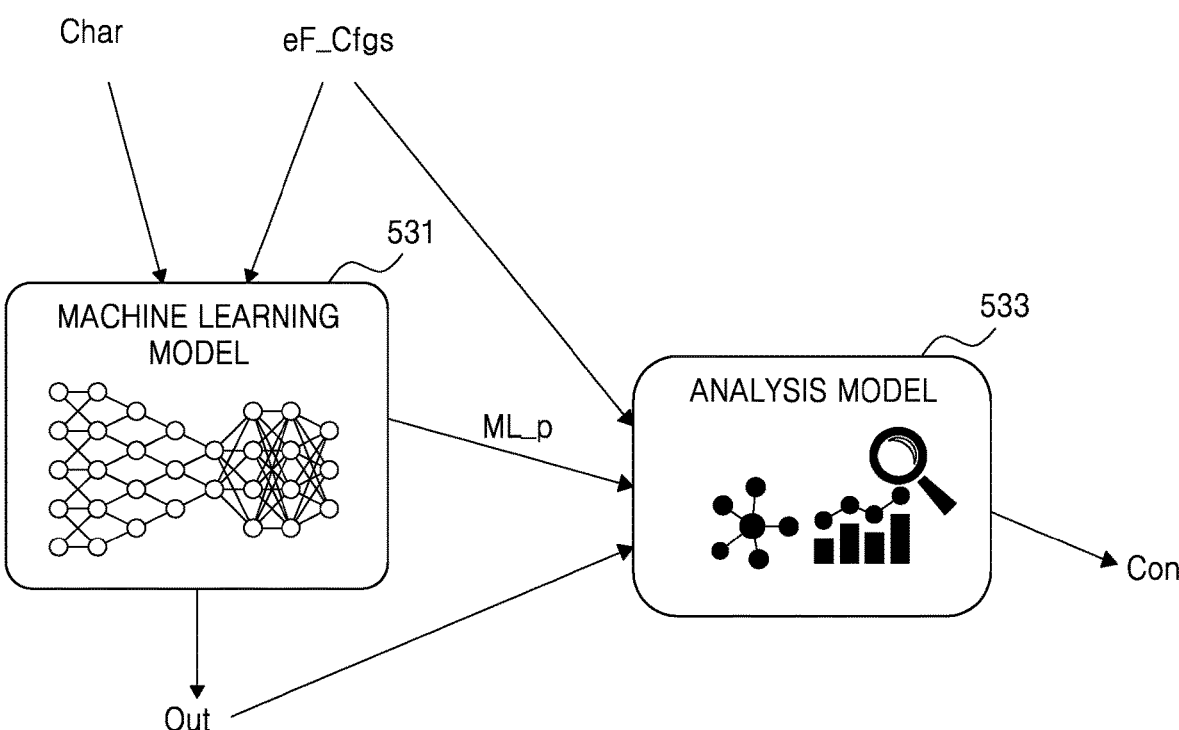

FIGS. 7 and 8 are diagrams for explaining a contribution calculation process according to an embodiment.

Referring to FIGS. 5 to 8, the method according to an embodiment may calculate the contribution Con based on a machine learning model 531 and an analysis model 533. That is, operation S330 of calculating the contribution Con may include training the machine learning model 531 (S331), predicting characteristics of a circuit (S333), and calculating the contribution Con of each of the fuse data eF_DTA (S335).

In some embodiments, as described above, the machine learning model 531 may receive the E-Fuse configurations eF_Cfgs and the characteristics Char of the circuit respectively corresponding thereto. The machine learning model 531 may train the characteristics Char according to fuse configurations by matching the fuse configurations and result values corresponding thereto (S331). Based on training, the machine learning model 531 may predict new characteristics as the result values Out (S333). That is, the machine learning model 531 may predict new characteristics according to the E-Fuse configurations eF_Cfgs by using various machine learning parameters ML p based on the training. The analysis model 533 may calculate the contribution Con based on the new characteristics (S335). That is, the analysis model 533 may receive the E-Fuse configurations eF_Cfgs, data (e.g., information about the machine learning parameters ML p) of the machine learning model 531, and the result values Out of the machine learning model 531, analyze such input values, and calculate the contribution Con.

In some embodiments, the machine learning model 531 may predict the new characteristics (e.g., parameters used by the machine learning model 531 for prediction), and the analysis model 533 may interpret the correlations between the E-Fuse configurations eF_Cfgs and the new characteristics that are the result values Out obtained from the trained machine learning model. For example, the analysis model 533 may analyze a correlation between the fuse data eF_DTA included in each of the E-Fuse configurations eF_Cfgs and each of the new characteristics. The analysis model 533 may interpret the input values to quantify an influence of the fuse data eF_DTA (or each bit of the fuse data eF_DTA) on the characteristics of the circuit. That is, the analysis model 533 may calculate the contribution Con of the fuse data eF_DTA (or each bit of the fuse data eF_DTA) to the characteristics of the circuit. As an embodiment, the analysis model 533 may use a Shapley value to calculate the contribution Con. The Shapley value may be a value used to quantify the influence of each bit of the fuse data eF_DTA on the characteristics of the circuit.

Figure 9:
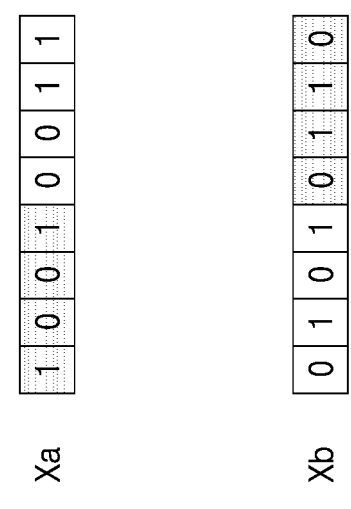
FIG. 9 is a diagram illustrating a crossover operation on fuse data according to an embodiment.
Figure 9:
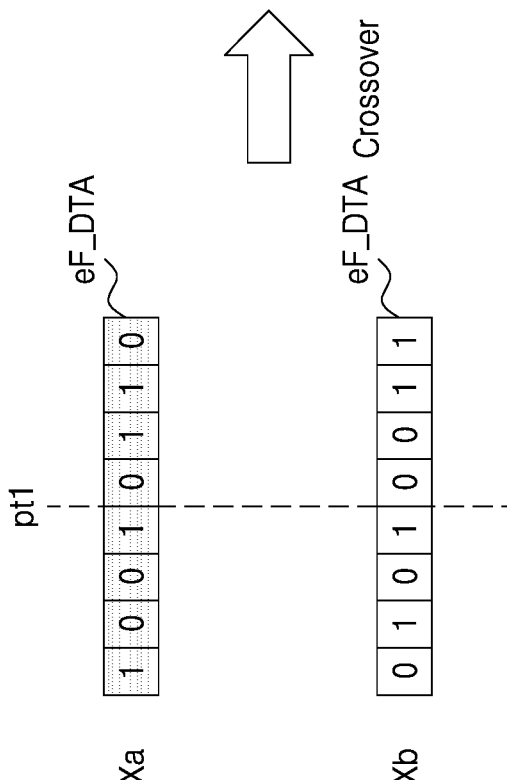

FIG. 9 is a diagram illustrating a crossover operation on the fuse data eF_DTA according to an embodiment.

Referring to FIGS. 5, 6, and 9, the variation module 540 may generate a new fuse configuration by varying a fuse configuration. Specifically, the variation module 540 may perform a variation operation by receiving the selected configurations Sel_Cfgs from the selection module 520 as described above (S360).

In some embodiments, the variation module 540 may perform the crossover operation on some of the selected configurations Sel_Cfgs. For example, a first fuse Xa and a second fuse Xb included in an arbitrary configuration among the selected configurations Sel_Cfgs may be a target of crossover. As shown, the variation module 540 may select a first point pt1 to perform the crossover operation. As shown, a bit arrangement of the fuse data eF_DTA of the first fuse Xa and a bit arrangement of the fuse data eF_DTA of the second fuse Xb may be changed to correspond to each other with respect to the first point pt1. Only the crossover operation is performed with respect to a single point in FIG. 9, but the inventive concept is not limited thereto and may be implemented in various ways. That is, for example, the crossover operation may be performed with respect to two or more points.

Figure 10:
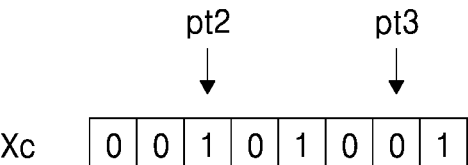
FIG. 10 is a diagram illustrating a mutation operation on fuse data according to an embodiment.
Figure 10:
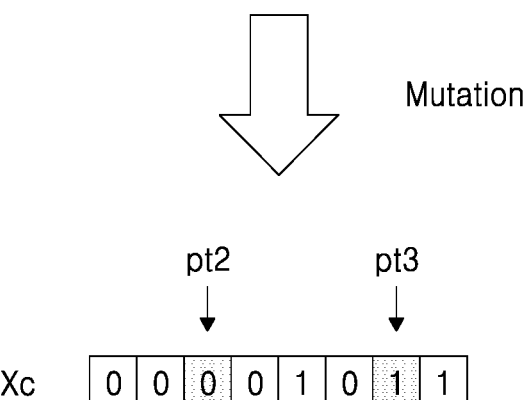

FIG. 10 is a diagram illustrating a mutation operation on fuse data according to an embodiment.

Referring to FIGS. 5, 6, and 10, the variation module 540 may generate a new fuse configuration by varying a fuse configuration. Specifically, the variation module 540 may perform a variation operation by receiving the selected configurations Sel_Cfgs from the selection module 520 as described above (S360).

In some embodiments, the variation module 540 may perform the mutation operation on some of the selected configurations Sel_Cfgs. For example, a third fuse Xc included in an arbitrary configuration among the selected configurations Sel_Cfgs may be a target of mutation. As shown, the variation module 540 may perform the mutation operation by selecting a second point pt2 and a third point pt3. As shown, values of bits corresponding to the second point pt2 and the third point pt3 of the third fuse Xc, that is, Xc[1] and Xc[5], may be changed (alternatively, the values may be inverted). Only the mutation operation is performed with respect to two points in FIG. 10, but the inventive concept is not limited thereto and may be implemented in various ways. That is, for example, the mutation operation may be performed with respect to a single point or three or more points.

As a result, the method according to an embodiment may vary upper configurations by scoring the characteristics, that is, vary configurations in which the characteristics are relatively effectively improved, thereby detecting or generating a more improved configuration, and also increasing the variety of configurations.

Figure 11:
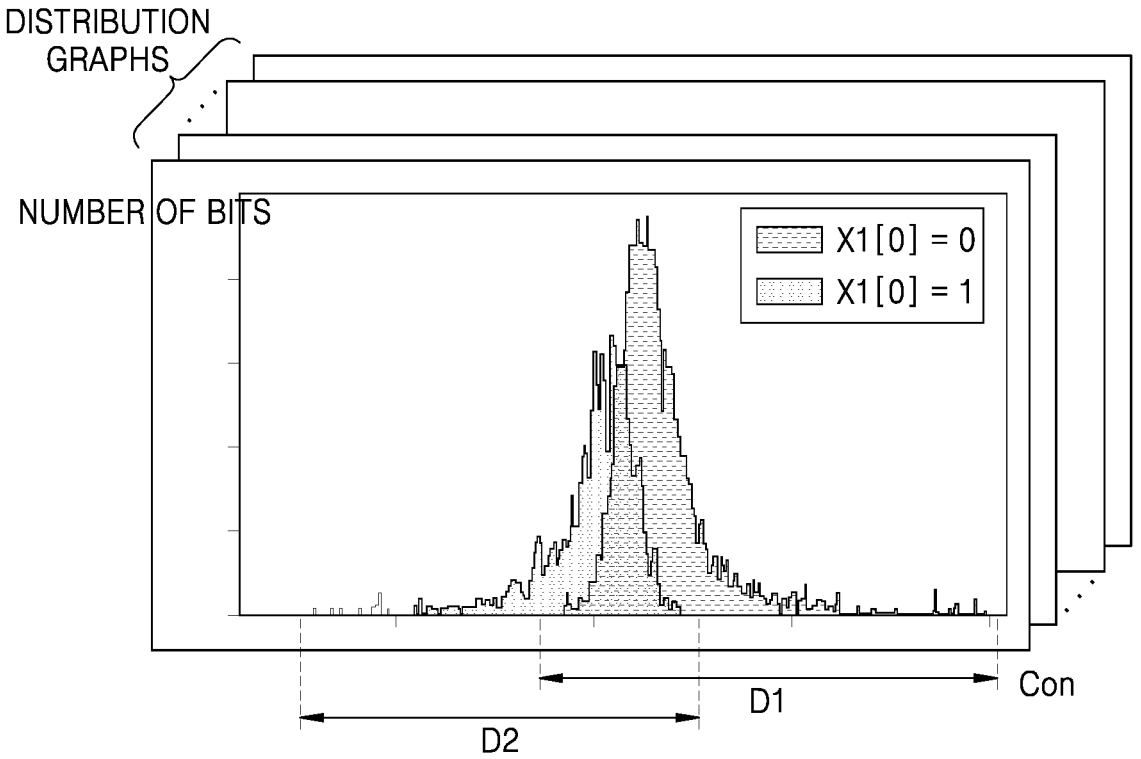
FIG. 11 is a graph illustrating a contribution distribution according to an embodiment.

FIG. 11 is a graph illustrating a contribution distribution according to an embodiment.

Referring to FIGS. 8 and 11, the contribution Con calculated by the contribution module 530 may have various distributions according to its value. As a result of calculating the contribution Con as described above with reference to FIG. 8 with respect to the E-Fuse configurations eF_Cfgs, each bit of the fuse data eF_DTA corresponding to each fuse may have various contributions according to its value.

In some embodiments, a distribution graph may indicate a distribution of bits according to the contribution Con. As an embodiment, in the fuse data eF_DTA of the fuse X1, a first bit X1[0] may have the contribution distribution as shown in FIG. 11 according to its value (e.g., 0 or 1). As a result of calculating the contribution Con of X1[0] with respect to the E-Fuse configurations eF_Cfgs, when the value of X1[0] is 0, the influence of X1[0] on a circuit, that is, the contribution Con, may be diverse throughout a period D1. The number of X1[0] corresponding to the contribution Con of each of the E-Fuse configurations eF_Cfgs, that is, the number of bits having the contribution Con, may have the distribution as shown. Similarly, with respect to the E-Fuse configurations eF_Cfgs, when the value of X1[0] is 1, the influence of X1[0] on the circuit, that is, the contribution Con, may be diverse throughout a period D2. The number of X1[0] corresponding to the contribution Con of each of the E-Fuse configurations eF_Cfgs may have the distribution as shown. The distribution graph may be obtained with respect to each bit of fuse data eF_DTA of all fuses. The variation module 540 may calculate a bit selection probability based on the distribution of the contribution Con, as described below with reference to FIGS. 12 to 15.

Figure 12:
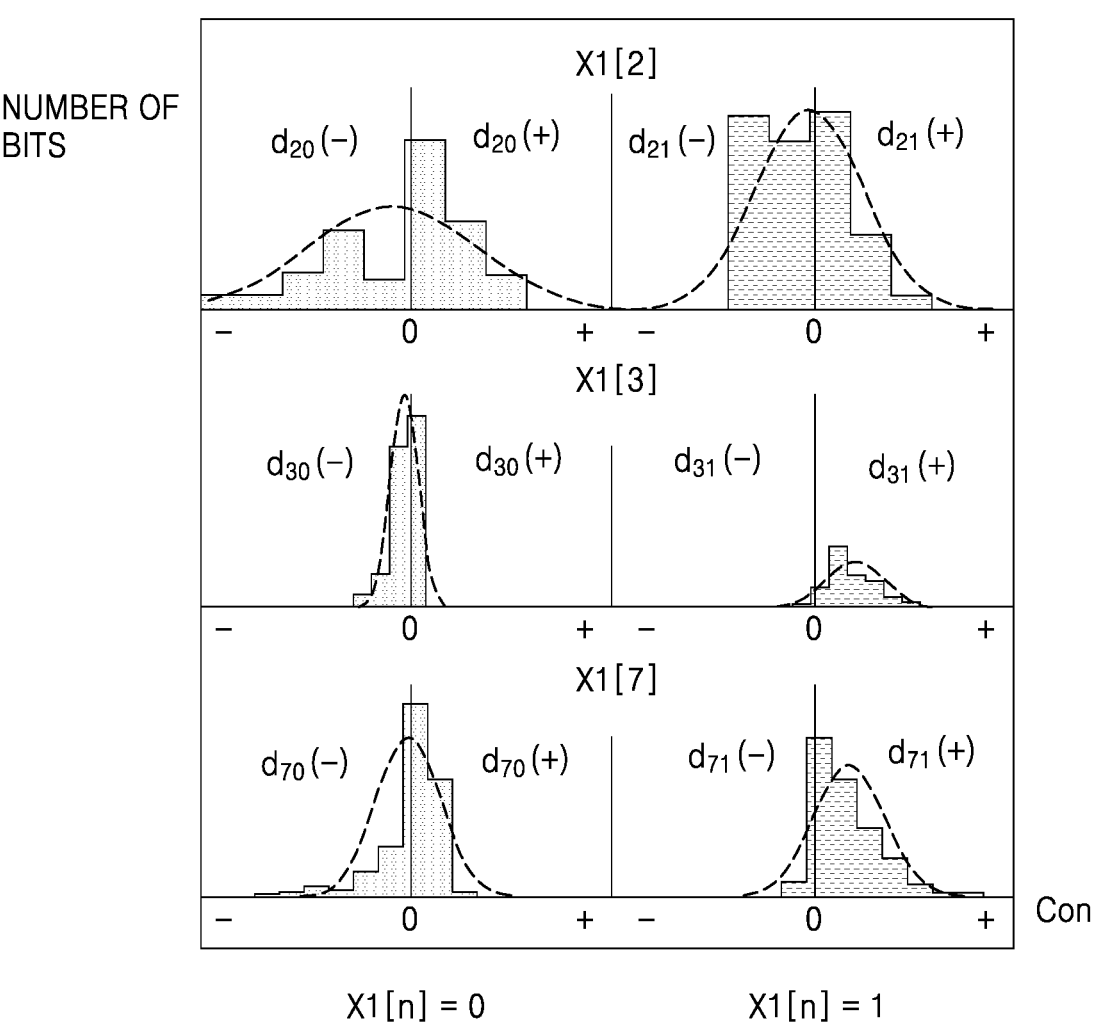
FIG. 12 is a diagram for explaining setting of a contribution distribution ratio for probability calculation, according to an embodiment.

FIG. 12 is a diagram for explaining setting of a contribution distribution ratio for probability calculation according to an embodiment.

Referring to FIGS. 5, 11, and 12, the variation module 540 may calculate a ratio of a distribution (or a probability of the contribution Con) based on a distribution of the contribution Con according to a specific value of each bit of the fuse data eF_DTA with respect to the E-Fuse configurations eF_Cfgs.

In some embodiments, the variation module 540 may calculate the contribution distribution ratio (hereinafter, the distribution ratio) of bits with respect to the specific value. As an embodiment, the specific value (or a reference value) may be set to 0. However, the specific value is not limited thereto and may be implemented as various values according to goals or settings. For example, a distribution ratio of the contribution Con of some bits of the fuse X1 such as bits X1[2], X1[3] and X1[7] may be distributed as shown in FIG. 12. As an embodiment, when a value of X1[2] is 0, a contribution distribution ratio of the number of bits having the contribution Con of 0 or less may be expressed as a contribution distribution ratio $d_{20}(-)$. For example, if the bit X1[2] has a value of 0, a contribution distribution ratio of the X1[2] having a value of 0, which has the contribution Con being 0 or less, is denoted as a contribution distribution ratio $d_{20}(-)$. On the other hand, a contribution distribution ratio of the number of bits having the contribution Con greater than 0 may be expressed as a contribution distribution ratio $d_{20}(+)$. For example, the contribution distribution ratio $d_{20}$ (+) may denote a contribution distribution ratio for the bit X1[2] having the value of 0 having the contribution Con greater than 0. When the value of X1[2] is 0, each of the ratios $d_{20}(-)$ and $d_{20}(+)$ may have a value between 0 and 1, and may have a value between 0 and 100 in a percentage. For example, the ratio $d_{20}(-)$ may be 0.4 and the ratio $d_{20}(+)$ may be 0.6. On the other hand, when the value of X1[2] is 1, the distribution ratio of the number of bits having the contribution Con of 0 or less may be expressed as a ratio $d_{21}(-)$, and the distribution ratio of the number of bits having the contribution Con greater than 0 may be expressed as a ratio $d_{21}(+)$. Similarly, when a value of X1[3] is 0 or 1, the distribution ratio according to a reference value of 0 may be expressed as a ratio $d_{30}(-)$ or a ratio $d_{31}(+)$, and when a value of X1 [7] is 0 or 1, the distribution ratio according to the reference value of 0 may be expressed as a ratio $d_{70}(-)$ or a ratio $d_{71}(+)$. Alternatively, in some embodiments, the distribution ratio may be calculated based on a reference range (e.g., a range less than 0). For example, the variation module 540 may calculate the distribution ratio of the number of bits having the contribution Con that satisfies the reference range. That is, the variation module 540 may calculate the distribution ratio in various ways.

In some embodiments, the variation module 540 may quantify the influence of a fuse itself (e.g., the fuse X1) on a circuit based on distributions of bits of each fuse, as described below with reference to FIG. 13. In some embodiments, the variation module 540 may calculate a bit selection probability indicating a probability that each bit needs to have a specific value in a new fuse configuration based on the distribution ratio of bits according to the above reference value (or satisfying the reference range), as described below with reference to FIGS. 14 and 15.

The variation module 540 has been described as calculating the distribution ratio of the contribution Con in FIG. 12, but a subject that calculates the distribution ratio of the contribution Con is not limited thereto. That is, for example, the distribution ratio of the contribution Con may be calculated by the contribution module 530 that calculates the contribution Con, or may be calculated by being included in a separate module or another module.

Figure 13:
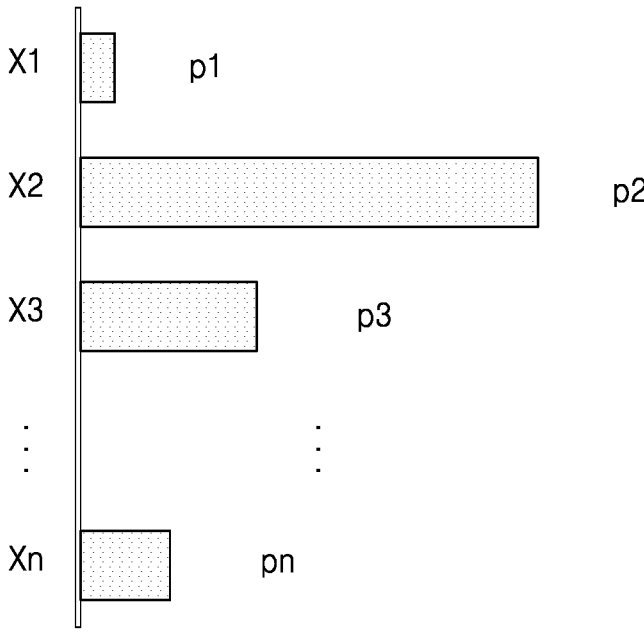
FIG. 13 is a graph illustrating the degree of influence of each fuse according to an embodiment.

FIG. 13 is a graph illustrating the degree of influence of each fuse according to an embodiment.

Referring to FIGS. 12 and 13, the test device 500 according to an embodiment may quantify the influence of each of the fuses X1 to Xn on a circuit.

As described above with reference to FIGS. 11 and 12, the contribution module 530 may calculate the contribution Con corresponding to the influence of each bit of the fuse data eF_DTA of each fuse on the circuit, and accordingly, obtain a distribution of the contribution Con of each bit. In some embodiments, the test device 500 may provide the degree of influence of each of the fuses X1 to Xn has on the circuit based on the distribution of the contribution Con of each bit. For example, the test device 500 may obtain the distribution of the contribution Con of each bit included in the fuse data eF_DTA of the fuse X1 (e.g., the distribution shown in FIG. 12), and obtain the number of bits corresponding to the contribution Con of a specific period (or the entire period) of each bit. As an example, the test device 500 may obtain an area of the distribution of the specific period (or the entire period). After calculating and summing areas of distributions of specific periods of the bits X1[0] to X1[7] of the fuse X1, the test device 500 may obtain the contribution Con of the fuse X1 itself. Similarly, the test device 500 may obtain the contribution Con of each of the remaining fuses X2 to Xn by repeating a process described above with respect to each of the remaining fuses X2 to Xn. Then, when the contribution Con of the fuse X1 is divided by the total sum of the contributions Con of the fuses X1 to Xn, a first degree of influence p1 quantifying the influence of the fuse X1 on the circuit may be provided. Similarly, a second degree of influence p2 to an nth degree of influence pn, which are the respective degrees of influence of the remaining fuses X2 to Xn, may be provided.

As a result, the method according to an embodiment may quantify how much each of fuses has an effect (i.e., a contribution) on the characteristics of the entire circuit (or a semiconductor device), and may provide this quantification value to a user, etc. Through this, the user, etc. may identify the influence of individual fuse, which may be useful to improve the circuit.

FIG. 14 is a diagram illustrating a method of calculating a bit selection probability according to an embodiment.

Referring to FIGS. 12 and 14, the variation module 540 may calculate the bit selection probability based on a distribution of the contribution Con of each bit of the fuse data eF_DTA. For example, the variation module 540 may calculate a probability that each bit needs to have a specific value in a new fuse configuration in order to improve characteristics of a circuit.

In some embodiments, the variation module 540 may determine that the characteristics of the circuit are improved when the contribution Con is less than a reference value (e.g., 0) (or satisfies a reference range). For example, when a characteristic of the circuit that is a target of calculation of the contribution Con is related to timing, the timing characteristic may be improved when the contribution Con is less than 0. In other words, a goal may be to make the contribution Con of each bit less than 0 in order to improve the timing characteristic of the circuit. For example, the sequences of FIG. 6 may be iterated until the contribution Con of each bit of the fuse data eF_DTA becomes less than 0. Accordingly, when the new fuse configuration is determined as being above the reference range such as 0, the variation module 540 may calculate the bit selection probability in the new fuse configuration for characteristic improvement as shown in FIG. 14.

More specifically, as described above, the goal may be to make the contribution Con of each bit less than 0. Therefore, the variation module 540 may calculate a probability that a new bit value needs to be selected as 0 or 1 to form a configuration having the improved characteristics, by using a probability that the characteristic is improved because the contribution Con is less than 0 when the value of the bit is 0 and a probability that the characteristic is improved because the contribution Con is less than 0 when the value of the bit is 1.

For example, as described above with reference to FIG. 12, the variation module 540 may obtain the distribution ratio $d_{20}(-)$ in which the contribution Con is less than 0 when the value of X1[2] is 0. In other words, when the value of X1[2] is 0, the probability that the characteristic is improved may correspond to the distribution ratio $d_{20}(-)$. Similarly, when the value of X1[2] is 1, the probability that the characteristic is improved may correspond to the distribution ratio $d_{21}(-)$. Accordingly, the variation module 540 may calculate the probability that the bit value needs to be selected in the new fuse configuration based on the distribution ratios $d_{20}(-)$ and $d_{21}(-)$. In some embodiments, the variation module 540 may have information of the distribution ratio $d_{20}(-)$ that the characteristic is improved when a new bit value is 0, that is, $P(s<0|X=0)$), and the distribution ratio $d_{21}(-)$ that the characteristic is improved when the new bit value is 1, that is, $P(s<0|X=1)$), and may generate or select the new bit value according to the probabilities $d_{20}(-)$ and $d_{21}(-)$. Accordingly, the variation module 540 may calculate the bit selection probability based on those shown in FIG. 14. For example, the probability that the value of X1[2] of the fuse X1 is selected as 0 in the new fuse configuration is a value obtained by dividing the distribution ratio $d_{20}(-)$ by the sum (that is, $P(s<0|X=0)+P(s<0|X=1)$) of the distribution ratio $d_{20}(-)$ and the distribution ratio $d_{21}(-)$. Similarly, the probability that the value of X1[2] is selected as 1 is a value obtained by dividing the distribution ratio $d_{21}(-)$ by the sum of the distribution ratio $d_{20}(-)$ and the distribution ratio $d_{21}(-)$. In one embodiment, when the value of X1[2] is 0, the ratio $d_{20}(-)$ at which the contribution Con is less than 0 has a percentage of 40%, and when the value of X1[2] is 1, the ratio $d_{21}(-)$ at which the contribution Con is less than 1 has a percentage of 58%, the variation module 540 may calculate, as approximately 41%, the probability that the value of X1[2] is selected as 0, and, as approximately 59%, the probability that the value of X1[2] is selected as 1 in the new fuse configuration. The variation module 540 may calculate the bit selection probability with respect to each of all bits of the fuses in the above manner, and as a result, the new fuse configuration may be generated in a direction in which characteristics are improved based on the bit selection probability.

In FIG. 14, the reference value of the contribution Con for improving the characteristics is set to 0, but is not limited thereto. That is, for example, the reference value may be implemented as a variety of values other than 0, or the bit selection probability may be calculated based on a distribution ratio having the contribution Con greater than or equal to the reference value according to a goal. Similarly, a reference range of the contribution Con for improving the characteristics may be implemented in various ways.

FIG. 15 is a diagram illustrating bit selection probabilities for characteristic improvement according to an embodiment.

Referring to FIGS. 14 and 15, the variation module 540 may generate a new fuse configuration for improving a plurality of characteristics by calculating bit selection probabilities corresponding to characteristics of a plurality of various circuits.

As an embodiment, a target characteristic of a circuit to be improved may include a first characteristic Y1 (e.g., a characteristic related to timing such as a timing margin of an operation parameter) and a second characteristic Y2 (e.g., a characteristic related to voltage). In the same manner as described above with reference to FIGS. 12 and 14, the variation module 540 may calculate the bit selection probabilities to respectively correspond to the characteristics. Specifically, as described above with reference to FIG. 8, the contribution module 530 may calculate the contribution Con corresponding to the degree of influence of each bit on the first characteristic Y1 and the contribution Con corresponding to the degree of influence of each bit on the second characteristic Y2. The variation module 540 may receive the contribution Con corresponding to the first characteristic Y1 and the contribution Con corresponding to the second characteristic Y2 and calculate bit selection probabilities respectively corresponding thereto. As described above with reference to FIG. 14, the variation module 540 may calculate a probability of selecting a value of each bit in a new fuse configuration to improve the first characteristic Y1. For example, a bit selection probability (P X1[2]) of X1[2] with respect to the first characteristic Y1 may include a probability $P_{Y1\_20}$ of selecting a bit value as 0 and a bit selection probability $P_{Y1\_21}$ of selecting the bit value as 1 to improve the first characteristic Y1. Similarly, a bit selection probability P X1[3] of X1[3] with respect to the first characteristic Y1 may be calculated as a probability $P_{Y1\_30}$ of selecting the bit value as 0 and a probability $P_{Y1\_31}$ of selecting the bit value as 1, and a bit selection probability P X1[7] of X1[7] may be calculated as a probability $P_{Y1\_70}$ of selecting the bit value as 0 and a probability $P_{Y1\_71}$ of selecting the bit value as 1. Similarly, the variation module 540 may calculate the bit selection probabilities $P_{Y2\_20}$ to $P_{Y2\_71}$ for improving the second characteristic Y2. In FIG. 15, probabilities with respect to some bits are shown for the simplicity of description. A first bit selection probability for improving the first characteristic Y1 may include bit selection probabilities corresponding to all bits, and a second bit selection probability for improving the second characteristic Y2 may include bit selection probabilities corresponding to all the bits.

In some embodiments, the variation module 540 may generate new fuse configurations respectively corresponding to the first bit selection probability and the second bit selection probability. That is, new first fuse configurations may be generated based on the first bit selection probability to improve the first characteristic Y1, and new second fuse configurations may be generated based on the second bit selection probability to improve the second characteristic Y2. Also, in some embodiments, the variation module 540 may adjust a generation ratio of the first fuse configurations and the second fuse configurations according to a specific goal.

As a result, in the inventive concept, the new fuse configurations may be generated to improve a plurality of various characteristics of the circuit. In FIG. 15, two characteristics are shown, but the inventive concept is not limited thereto, and in order to improve a larger number (i.e., more types) of characteristics, new fuse configurations may be respectively generated by reflecting the characteristics.

Figure 16:
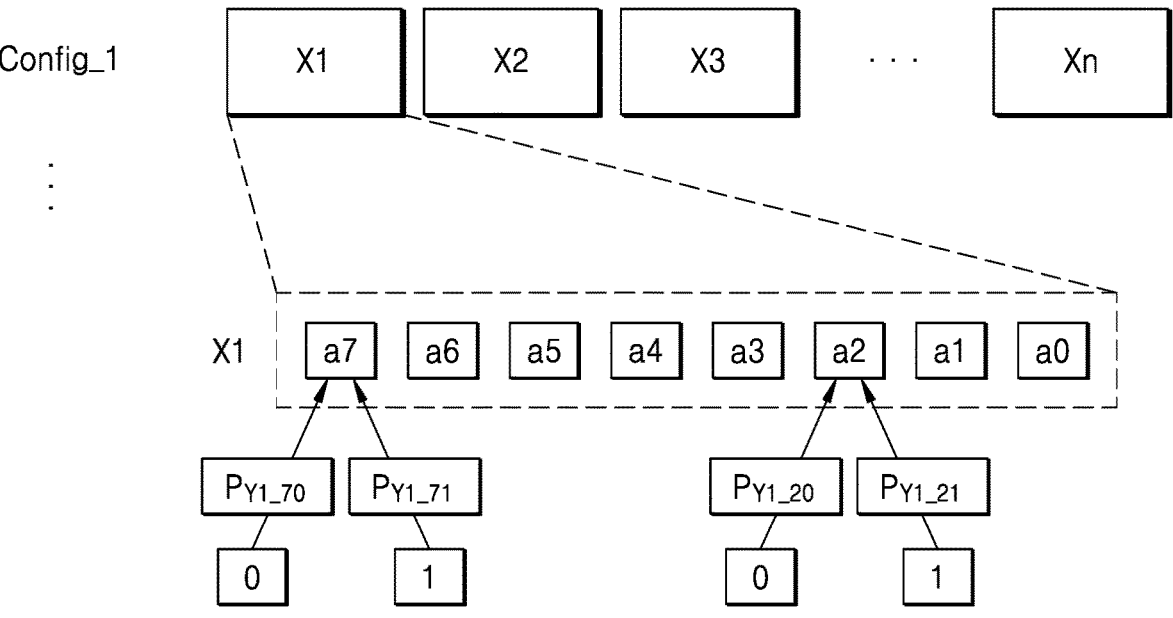
FIG. 16 is a diagram for explaining a method of generating a new fuse configuration, according to an embodiment.

FIG. 16 is a diagram for explaining a method of generating a new fuse configuration according to an embodiment.

Referring to FIGS. 14 to 16, the variation module 540 may generate new fuse configurations based on bit selection probabilities. Descriptions redundant with those given above with reference to the drawings are omitted.

The variation module 540 may generate new first fuse configurations based on a first bit selection probability for improving the first characteristic Y1. For example, when selecting a new value a2 of a third bit of the fuse X1 among a bit value of 0 and a bit value of 1, the variation module 540 may select a bit value of 0 or a bit value of 1 based on the bit selection probability P X1[2] of X1[2]. That is, the new value a2 of the third bit of the fuse X1 may be selected as 0 at the probability $P_{Y1\_20}$ and may be selected as 1 at the probability $P_{Y1\_21}$. In addition, when selecting a new value a7 of an eighth bit of the fuse X1, the variation module 540 may select the bit value based on the bit selection probability P X1[7] of X1[7]. That is, the new value a7 of the eighth bit of the fuse X1 may be selected as 0 at the probability $P_{Y1\_70}$ and may be selected as 1 at the probability $P_{Y1\_71}$. Although not shown in FIG. 16, other bit values a0, a1, a3 to a6 of the fuse X1 may also be selected in the same manner as described above. In addition, although not shown in FIG. 16, bit values may also be respectively selected in the same manner as described above with respect to the remaining fuses X2 to Xn. As described above, the variation module 540 may generate a new first E-Fuse configuration Config 1, and repeat a process described above to generate more E-Fuse configurations included in the new first E-Fuse configurations Config 1. That is, because each bit value is selected according to a probability, various E-Fuse configurations may be generated. Also, although not shown in FIG. 16, the variation module 540 may generate new second fuse configurations in the same manner as described above, based on a second bit selection probability for improving the second characteristic Y2. Through this, new fuse configurations for improving a plurality of various characteristics may be generated.

While the inventive concept has been particularly shown and described with reference to embodiments thereof, it will be understood that various changes in form and details may be made therein without departing from the spirit and scope of the following claims.

What is claimed is:

1. A method of generating a fuse configuration for trimming a circuit, the method comprising:
   evaluating characteristics, corresponding to each of a plurality of fuse configurations, of the circuit trimmed based on the plurality of fuse configurations respectively;
   selecting at least one fuse configuration from among the plurality of fuse configurations, based on a result of the evaluating the characteristics of the circuit;
   calculating contribution information by calculating a degree of influence of fuse data of each of the plurality of fuse configurations to the characteristics of the circuit, based on the plurality of fuse configurations and the characteristics; and
   generating at least one new fuse configuration, based on the selected at least one fuse configuration and the contribution information.

2. The method of claim 1,
   wherein the calculating the contribution information includes:
   receiving the plurality of fuse configurations and the characteristics of the circuit;
   predicting new characteristics of the circuit based on the characteristics and the plurality of fuse configurations using a trained machine learning model; and
   generating the contribution information based on the new characteristics.

3. The method of claim 2,
   wherein the generating the contribution information includes:
   analyzing correlations between the plurality of fuse configurations and the new characteristics of the circuit based on the trained machine learning model.

4. The method of claim 1, wherein the generating of the at least one new fuse configuration includes:
   calculating a bit selection probability, which is a probability of selecting a value of each of bits of new fuse data, based on the contribution information; and
   varying a composition of fuse data of the selected at least one fuse configuration.

5. The method of claim 1, further comprising:
   outputting a final fuse configuration corresponding to a characteristic that satisfies a reference condition among the characteristics corresponding to each of the plurality of fuse configurations.

6. The method of claim 5, wherein the outputting of the final fuse configuration includes:

outputting a fuse configuration having least characteristic variation as the final fuse configuration when there are two or more fuse configurations that satisfy the reference condition.

7. The method of claim 1, wherein the evaluating of the characteristics of the circuit includes scoring the characteristics of the circuit according to the plurality of fuse configurations.

8. The method of claim 7, wherein the selecting of the at least one fuse configuration includes selecting fuse configurations having a score greater than or equal to a reference score from among the plurality of fuse configurations, based on a result of scoring the characteristics of the circuit.

9. The method of claim 4, wherein the calculating of the bit selection probability includes calculating a contribution distribution ratio of each bit of the fuse data having the contribution information satisfying a reference range.

10. The method of claim 4, wherein each of the characteristics of the circuit includes a first characteristic and a second characteristic,
   wherein the calculating of the contribution information includes:
   calculating a first contribution information corresponding to the first characteristic; and
   calculating a second contribution information corresponding to the second characteristic, and
   wherein the calculating of the bit selection probability includes:
   calculating a first bit selection probability, based on the first contribution information; and
   calculating a second bit selection probability, based on the second contribution information.

11. The method of claim 4, wherein the varying the composition of the fuse data includes:
   performing a crossover operation on at least two pieces of fuse data among the fuse data of the selected at least one fuse configuration.

12. The method of claim 4, wherein the varying of the composition of the fuse data includes:
   performing a mutation operation on at least one piece of fuse data among the fuse data of the selected at least one fuse configuration.

13. A test device for generating a fuse configuration for trimming a circuit, the test device comprising:
   an evaluation module configured to evaluate characteristics, corresponding to each of a plurality of fuse configurations, of the circuit trimmed based on the plurality of fuse configurations respectively;
   a selection module configured to select at least one fuse configuration from among the plurality of fuse configurations, based on a result of evaluating the characteristics of the circuit;
   a contribution module configured to calculate contribution information by calculating a degree of influence of fuse data of each of the plurality of fuse configurations to characteristics of the circuit, based on the plurality of fuse configurations and the characteristics; and
   a variation module configured to generate at least one new fuse configuration, based on the selected at least one fuse configuration and the contribution information.

14. The test device of claim 13,
   wherein the contribution module is configured to:
   receive the plurality of fuse configurations and the characteristics of the circuit;
   predict new characteristics of the circuit based on the characteristics and the plurality of fuse configurations using a trained machine learning model; and generate the contribution information based on the new characteristics.

15. The test device of claim 14, wherein the contribution module is configured to analyze correlation between the plurality of fuse configurations and the new characteristics of the circuit based on the trained machine learning model.

16. The test device of claim 13, wherein the variation module is configured to:

calculate a bit selection probability, which is a probability of selecting a value of each of bits of new fuse data, based on the contribution information; and vary a composition of fuse data of the selected at least one fuse configuration.

17. The test device of claim 16, wherein the variation module is configured to calculate a contribution distribution ratio of each bit of the fuse data having the contribution information satisfying a reference range.

18. The test device of claim 16, wherein each of the characteristics of the circuit include a first characteristic and a second characteristic, wherein the contribution module is configured to calculate first contribution information and a second contribution information corresponding to the first characteristic and the second characteristic, respectively, and wherein the variation module is configured to calculate a first bit selection probability and a second bit selection probability corresponding to the first contribution information and the second contribution information, respectively.

19. A system comprising:

a semiconductor device configured to:

receive a plurality of fuse configurations; and output characteristics, corresponding to each of the plurality of fuse configurations, of the semiconductor device that is trimmed respectively according to the plurality of fuse configurations; and a test device configured to:

generate at least one new fuse configuration, based on the plurality of fuse configurations and the characteristics of the semiconductor device; and provide the at least one new fuse configuration to the semiconductor device, wherein the test device is further configured to:

evaluate the characteristics of the semiconductor device trimmed based on the plurality of fuse configurations respectively, select at least one fuse configuration from among the plurality of fuse configurations, based on a result of evaluating the characteristics of the semiconductor device, calculate contribution information by calculating a degree of influence of fuse data of each of the plurality of fuse configurations to the characteristics of the semiconductor device, based on the plurality of fuse configurations and the characteristics of the semiconductor device, and generate at least one new fuse configuration, based on the selected at least one fuse configuration and the contribution information.

20. The system of claim 19, wherein the test device is configured to:

receive the plurality of fuse configurations and the characteristics of the semiconductor device;

predict new characteristics of the semiconductor device based on the characteristics of the semiconductor device and the plurality of fuse configurations using a trained machine learning model;

generate the contribution information based on the new characteristics; and analyze correlations between the plurality of fuse configurations and the new characteristics of the semiconductor device based on the trained machine learning model.

* * * * *